United States Patent
Kwon et al.

(10) Patent No.: US 8,294,499 B2
(45) Date of Patent: Oct. 23, 2012

(54) CLOCK SIGNAL GENERATION CIRCUIT FOR REDUCUING CURRENT CONSUMPTION, AND SEMICONDUCTOR DEVICE HAVING THE SAME

(75) Inventors: Sang-Hyuk Kwon, Seoul (KR); Byung Hoon Jeong, Hwasung-si (KR); Jae Woong Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/659,881

(22) Filed: Mar. 24, 2010

(65) Prior Publication Data

US 2010/0244915 A1   Sep. 30, 2010

(30) Foreign Application Priority Data

Mar. 30, 2009   (KR) .................. 10-2009-0027042

(51) Int. Cl.
*H03K 3/84* (2006.01)
(52) U.S. Cl. .................. 327/164; 327/158; 327/165
(58) Field of Classification Search .................. 327/158, 327/164, 165
See application file for complete search history.

(56) References Cited

U.S. PATENT DOCUMENTS
2004/0081013 A1* 4/2004 Lee et al. ...................... 365/233

FOREIGN PATENT DOCUMENTS
KR   10-2004-0005888   1/2004
KR   10-2007-0027126   3/2007

* cited by examiner

*Primary Examiner* — John Poos
(74) *Attorney, Agent, or Firm* — Harness, Dickey & Pierce, P.L.C.

(57) ABSTRACT

In an example embodiment, the semiconductor device includes a clock signal generation circuit. The clock signal generation circuit is configured to generate at least one control clock signal in response to an external clock signal and a read command signal. The clock signal generation circuit includes a plurality of delay circuits, and the clock signal generation circuit is configured to selectively disable at least one of the plurality of delay circuits to reduce power consumption.

5 Claims, 5 Drawing Sheets

CLOCK SIGNAL GENERATION CIRCUIT FOR REDUCUING CURRENT CONSUMPTION, AND SEMICONDUCTOR DEVICE HAVING THE SAME

CROSS-REFERENCE TO RELATED APPLICATIONS

This application claims priority from Korean Patent Application No. 10-2009-0027042, filed on Mar. 30, 2009, in the Korean Intellectual Property Office (KIPO), the entire contents of which are incorporated herein by reference.

BACKGROUND

Embodiments of the present inventive concepts relate to a semiconductor device, and more particularly, to a clock signal generation circuit for reducing current consumption and a semiconductor device having the same.

Generally, a synchronous semiconductor device is a device synchronized to an external clock signal supplied from outside and operating at a high speed. The synchronous semiconductor device may adjust an operational timing of the synchronous semiconductor device by using the external clock signal, and prevent an error of the synchronous semiconductor device.

The semiconductor device includes a plurality of clock domains. A clock signal generator circuit may generate internal clock signals appropriate to internal circuits of the semiconductor device by using the external clock signal. All signals in a clock domain may be synchronized with an identical clock signal, e.g., an external clock signal.

In addition, when an external clock signal supplied from outside is used in an internal circuit of a synchronous semiconductor device, time delay or clock skew may occur while the external clock signal passes through the internal circuit. The clock signal generation circuit may compensate time delay occurring in the internal circuit by using a replica path modeling a transmission path of an actual clock tree.

Recently, as a semiconductor device is gradually operating at higher speeds, an operational frequency used in the semiconductor device becomes higher and higher and this causes increasing power consumption.

SUMMARY

The present general inventive concepts relate to a clock signal generator circuit capable of reducing power consumption and/or a semiconductor device including the same.

An example embodiment of the present invention is directed to a semiconductor device including a signal generation circuit configured to generate an internal read command signal by delaying a read command signal and configured to generate a first clock signal by dividing an external clock signal. A determination unit is configured to generate a control signal and an internal clock signal based on a phase of the first clock signal and a phase of a control clock signal. The internal clock signal having an identical phase or an opposite phase to the first clock signal. A control clock signal generation unit is configured to generate a first latency control clock signal by delaying the clock signal output from the determination unit, generating the control clock signal by delaying a second clock signal divided from the external clock signal by using a plurality of delay circuits and generating a plurality of second latency control clock signals respectively having a different phase from the second clock signal. The plurality of delay circuits become enabled or disabled in response to the control signal.

In one embodiment, a latency generation unit is configured to adjust latency of the internal read command signal by using the first latency control clock signal and the plurality of second latency control clock signals.

A division rate of the first clock signal and a division rate of the second clock signal may be the same. For example, the first clock signal and the second clock signal equal the external clock signal divided by 2.

The latency generation unit may be configured to latch the internal read command signal in response to the first latency control clock signal, adjust the latency by shifting the latched internal read command signal in response to at least one of the plurality of second latency control clock signals.

An example embodiment of the present invention is directed to a semiconductor device, including a latency signal generation circuit configured to generate a latency signal in response to an external clock signal and a read command signal and an output buffer configured to bufferreceived data in response to the latency signal. The latency signal generation circuit includes a signal generation circuit configured to generate an internal read command signal by delaying a read command signal and configured to generate a first clock signal by dividing the external clock signal, A determination unit is configured to generate a control signal and an internal clock signal based on a phase of the first clock signal and a phase of a control clock signal. The internal clock signal having an identical phase or an opposite phase to the first clock signal. A latency control clock signal generation unit is configured to generate a first latency control clock signal by delaying the internal clock signal output from the determination unit, generate the control clock signal by delaying a second clock signal divided from the external clock signal by using a plurality of delay circuits, and generate a plurality of second latency control clock signals respectively having different phases from the second clock signal. A latency generation unit is configured to adjust latency of the internal read command signal by using the first latency control clock signal and the plurality of second latency control clock signals. The plurality of delay circuits become enabled or disabled in response to the control signal.

A division rate of the first clock signal and a division ratio of the second clock signal may be the same. For example, the first clock signal and the second clock signal may equal the external clock signal divided by 2.

In an example embodiment, the semiconductor device includes a clock signal generation circuit. The clock signal generation circuit is configured to generate at least one control clock signal in response to an external clock signal and a read command signal. The clock signal generation circuit includes a plurality, of delay circuits, and the clock signal generation circuit is configured to selectively disable at least one of the plurality of delay circuits to reduce power consumption.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Example embodiments will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 1:
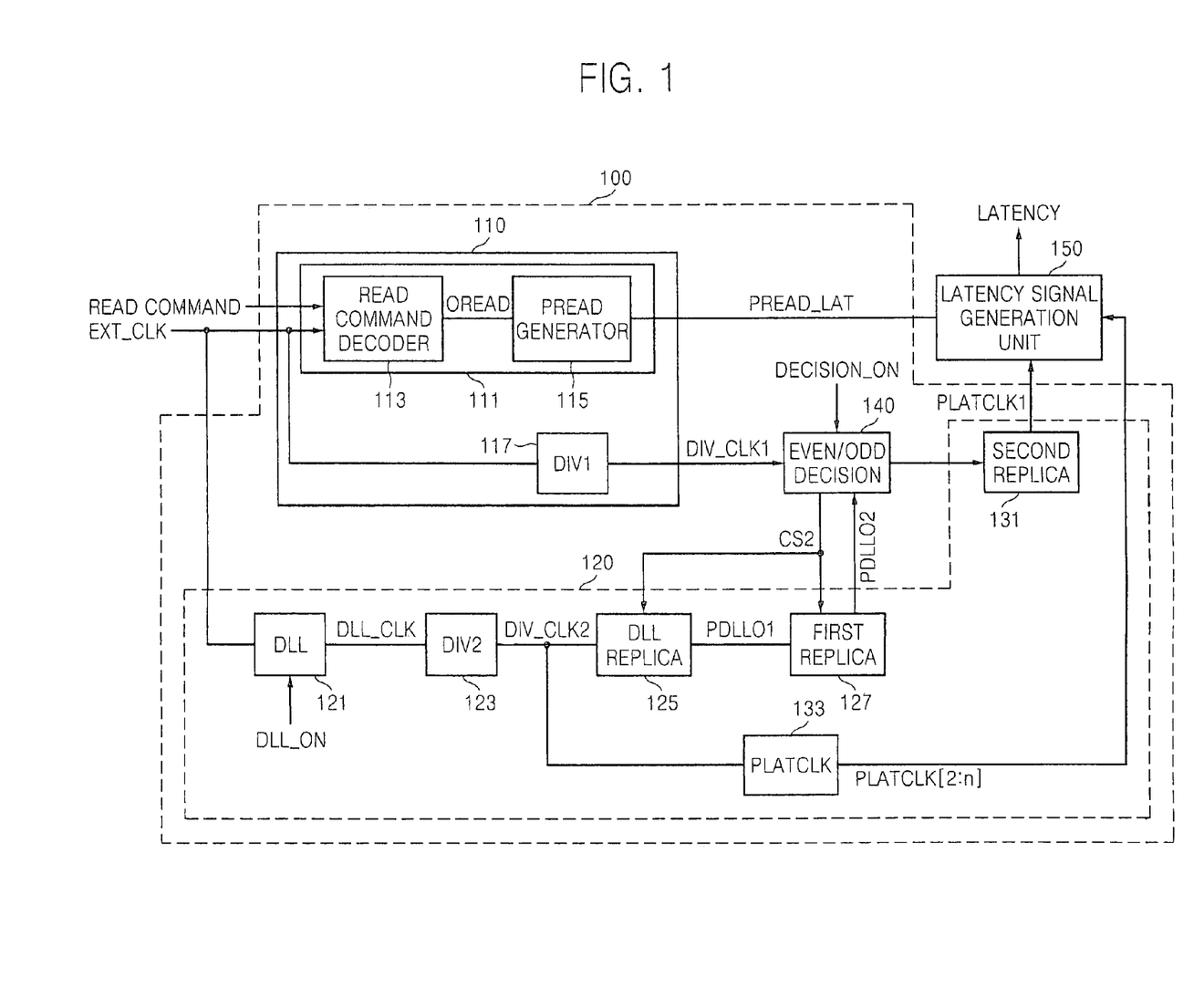
FIG. 1 shows a block diagram of a latency control circuit including a clock signal generation circuit according to an example embodiment.
Figure 5:
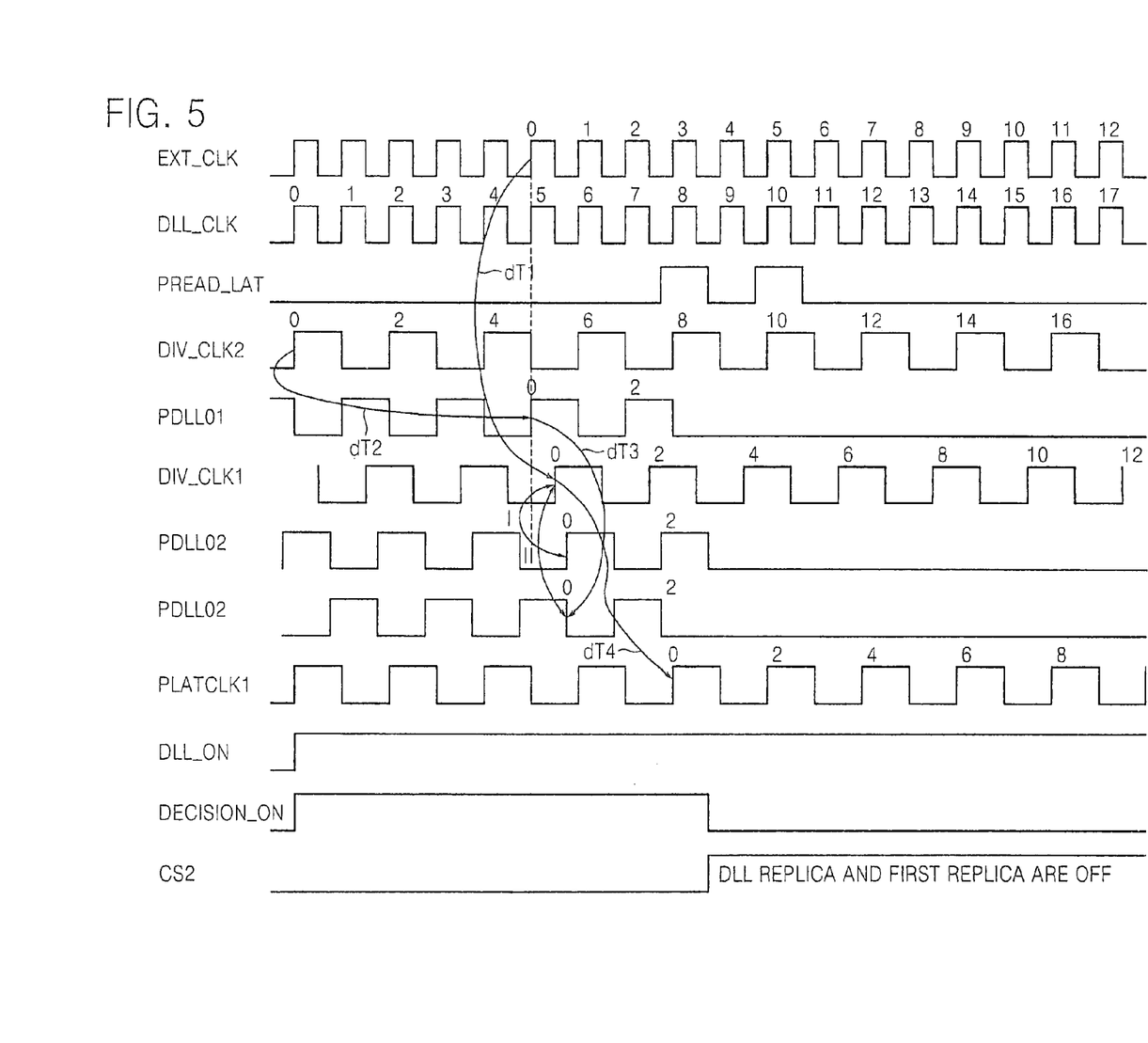
FIG. 5 shows a timing diagram for explaining operation of a clock signal generation circuit illustrated in FIG. 1 or 2.

FIG. 1 shows a latency control circuit including a block diagram of a clock signal generation circuit according to an example embodiment, and FIG. 5 shows a timing diagram for explaining an operation of a clock signal generation circuit illustrated in FIG. 1. Referring to FIGS. 1 and 5, a clock signal generation circuit 100, which may be used in a semiconductor device, may include a signal generation circuit 110, a latency control clock signal generation unit 120, and a determination unit 140. A latency signal generation unit 150 generates a latency signal LATENCY in response to control clocks from the clock signal generation circuit 100.

The semiconductor device may be a synchronous memory device like a synchronous dynamic random memory (SDRAM) and a double data rate (DDR) SDRAM. The semiconductor device may include a latency control circuit for generating a latency signal LATENCY in response to an external clock signal EXT_CLK and a read command signal READ COMMAND. An output buffer (not shown) may bufferreceived data in response to the latency signal LATENCY.

The signal generation circuit 110 is configured to generate a first clock signal DIV_CLK1 and an internal read command signal PREAD_LAT. The signal generation circuit 110 may include an internal read command signal generation unit 111 and a first clock divider 117. The internal read command signal generation unit 111 may include a read command decoder 113 and an internal read signal generation unit 115. The read command decoder 113 may receive a read command synchronized to the external clock signal EXT_CLK and output a decoded signal OREAD after decoding a received read command.

The internal read signal generation unit 115 may generate an internal read command signal PREAD_LAT in response to the decoded signal OREAD output from the read command decoder 113.

The first clock divider 117 may divide the external clock signal EXT_CLK by N, where N is a real number, and generate a N-divided clock signal DIV_CLK1, i.e., a first clock signal. For example, the first clock divider 117 may divide the external clock signal EXT_CLK by 2. A first delay time dT1 is delay time of the first clock divider 117. Here, the first delay time dT1 may be a value reflecting delay time of components 121, 123, 125 and 127 discussed below.

The latency control clock signal generation unit 120 may include a clock synchronization circuit 121 such as a delay locked loop (DLL), a second clock divider 123, a DLL replica 125, a first replica 127, a second replica 131 and a multi-clock generator 133. Each replica 125, 127 and 131 operating in response to a control signal CS is an example of a delay circuit.

The clock synchronization circuit 121 may generate a delay synchronization signal DLL_CLK synchronized with the external clock signal EXT_CLK by adjusting a difference between a phase of the external clock signal EXT_CLK and a phase of the delay synchronization signal DLL_CLK in response to an enable signal DLL_ON. Here, being synchronized may mean that a phase of the external clock signal EXT_CLK and a phase of a delay synchronization signal DLL_CLK are the same as each other or a phase difference between the two signals is within an acceptable range.

The DLL is illustrated as an example of the clock synchronization circuit 121 in FIG. 1, however, the present invention is not restricted to thereto and may include a device, e.g., a Phase Locked Loop (PLL) or a Synchronous Mirror Delay (SMD) circuit and so on, capable of supplying a delay synchronization signal CLL_CLK synchronized with the external clock signal EXT_CLK. The delay synchronization signal DLL_CLK may be used by a data processing device, e.g., as an operational clock signal of an input/output buffer, capable of processing a write data or a read data in a semiconductor device.

The second clock divider 123 may receive and divide the delay synchronization signal DLL_CLK output from the DLL 121 by M, where M is a real number equal or not equals to N, and output a M-divided signal DIV_CLK2, i.e., a second clock signal. The M-divided signal DIV_CLK2 may be a signal resulting from dividing a cycle of an external clock signal EXT_CLK by M times. For example, the second clock divider 123 may divide the external clock signal EXT_CLK by 2.

The DLL replica 125 may generate a first control clock signal PDLLO1 by delaying the M-divided signal DIV_CLK2 output from the second clock divider 123 as long as a second delay time dT2 in response to a control signal CS2. For example, when the DLL replica 125 becomes enabled or turns on in response to a control signal CS2 having a first logic level, e.g., a low level, the DLL replica 125 may output the first control clock signal PDLLO1 by delaying the M-divided signal DIV_CLK2 output from the second clock divider 123 as long as the second delay time dT2. In addition, the DLL replica 125 may become disabled or turn off in response to a control signal CS2 having a second logic level, e.g., a high level.

The first replica 127 may generate a second control clock signal PDLLO2 by delaying the first control clock signal PDLLO1 output from the DLL replica 125 as long as a third delay time dT3 in response to the control signal CS2. For example, when the first replica 127 becomes enabled in response to a control signal CS2 having a first logic level, e.g., a low level, the first replica 127 may output the second control clock signal PDLLO2 by delaying the first control clock signal PDLLO1 output from the DLL replica 125 as long as the third delay time dT3. In addition, the first replica 127 may become disabled or turn off in response to a control signal CS2 having a second logic level, e.g., a high level.

The determination unit 140 operating in response to an enable signal DECISION_ON may compare a phase of a N-divided signal DIV_CLK1 output from the signal generation circuit 110 with a phase of the second control clock signal PDLLO2 output from the first replica 127, and output one of a even clock signal and an odd clock signal of the N-divided signal DIV_CLK to a second replica 131 according to a comparison result. A phase difference between the even clock signal and the odd clock signal may be 180 degrees. For example, the determination unit 140 may output an even clock signal having an identical phase (in-phase) to a phase of the N-divided signal DIV_CLK1 or an odd clock signal having an opposite phase (180 out-of phase) to the N-divided signal DIV_CLK1 according to the comparison result. According to an embodiment, the determination unit 140 may generate a control signal CS for disabling each replica 125 and 127 after determining which of the even clock signal and the odd clock signal to output.

Figure 2:
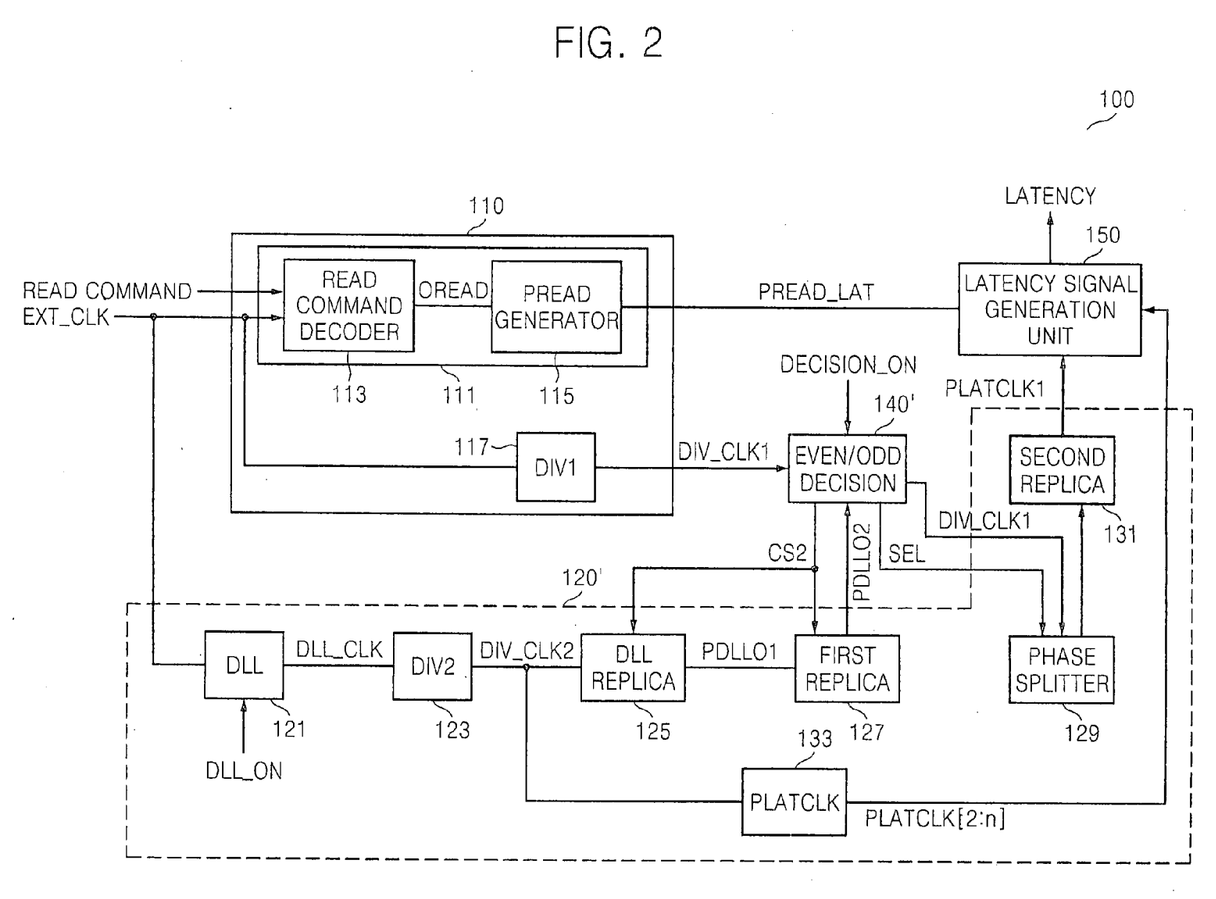
FIG. 2 shows a block diagram of a latency control circuit including a clock signal generator according to another example embodiment.
Figure 3:
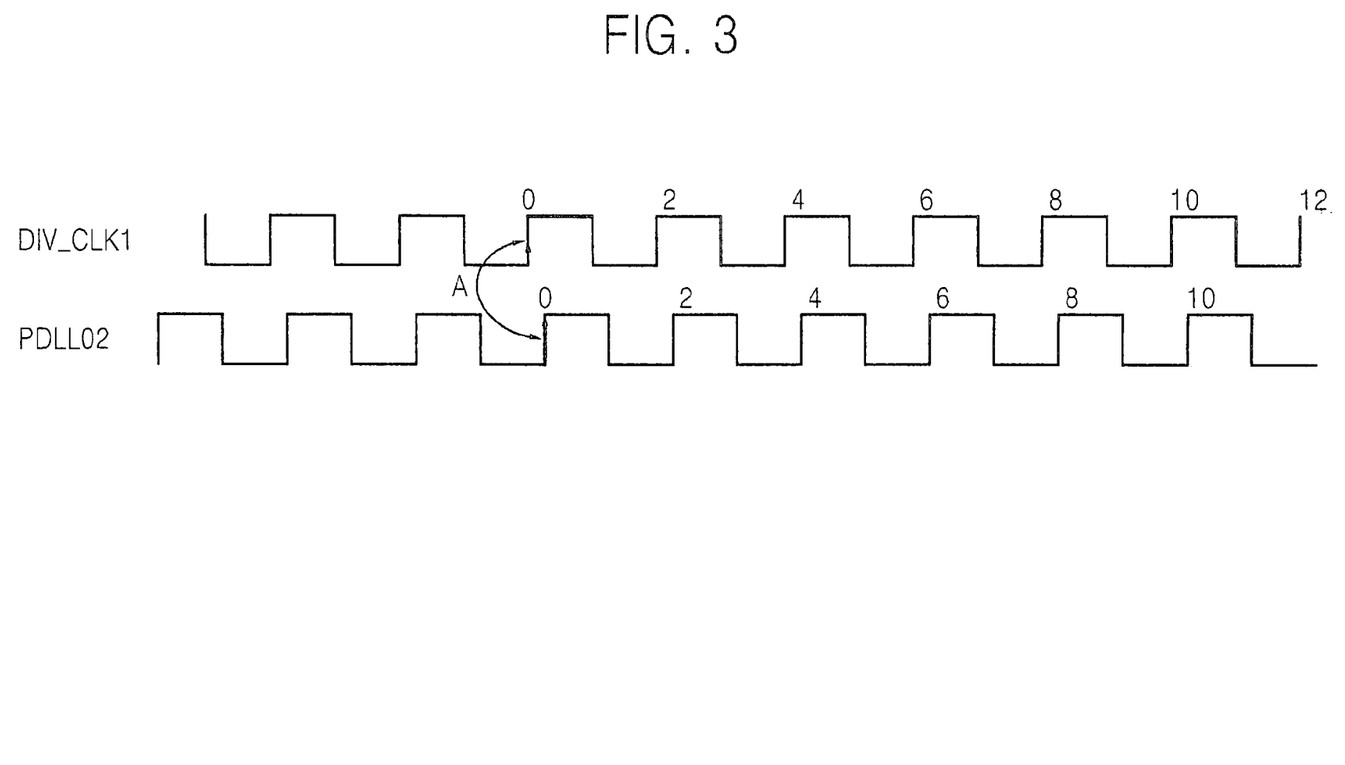
FIGS. 3 and 4 show timing diagrams for explaining operation of a determination unit illustrated in FIG. 1 or 2.
Figure 4:
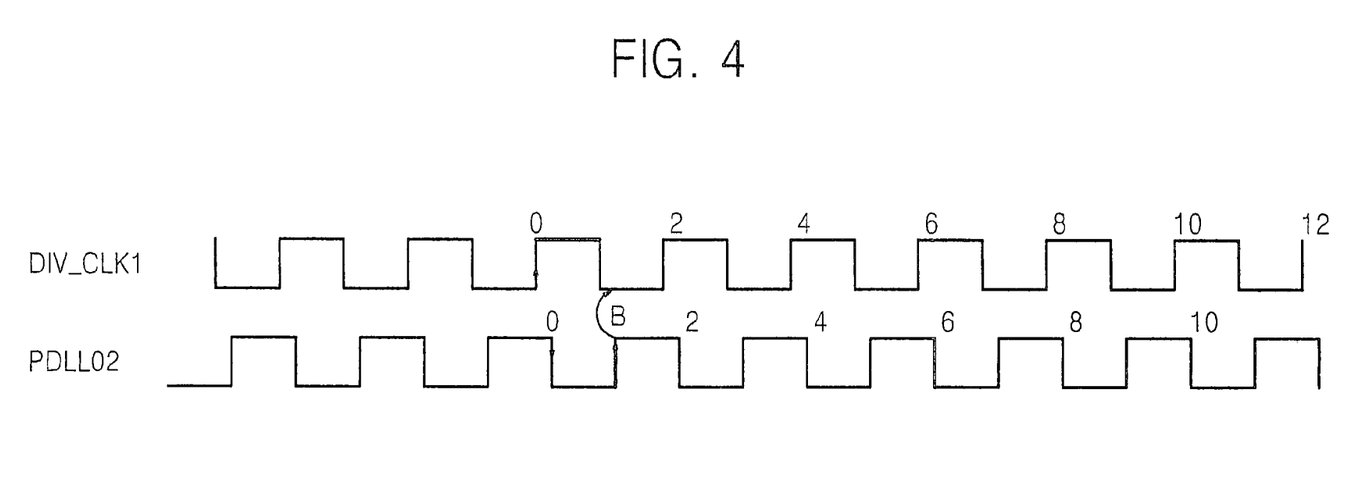

FIGS. 3-4 shows timing diagrams for explaining an operation of a determination unit illustrated in FIG. 1 or 2. And, FIG. 5 illustrates waveforms of a plurality of signals generated during operation of the clock signal generating circuit illustrated in FIGS. 1 and 2.

As illustrated in FIG. 3, the determination unit 140 may output an even clock signal, e.g., a clock signal having an in-phase to a phase of a N-divided signal DIV_CLK1, to a second replica 131 when the N-divided signal DIV_CLK1 is in a high level at a rising edge of a second control clock signal PDLLO2.

However, as illustrated in FIG. 4, the determination unit 140 may output an odd clock signal, i.e., a clock signal having 180 out-of phase to the N-divided signal DIV_CLK1, to the second replica 131 when the N-divided signal DIV_CLK1 is in a low level at a rising edge of the second control clock signal PDLLO2. For example, the determination unit 140 may be embodied as a flip-flop capable of determining a level of the N-divided signal DIV_CLK1 in response to the second control clock signal PDLLO2.

The determination unit 140 may generate a control signal CS2 for controlling an operation of the DLL replica 125 and the first replica 127. Accordingly, the DLL replica 125 and the first replica 127 may be enabled or disabled in response to the control signal CS2, respectively.

For example, the determination unit 140 may enable each of the DLL replica 125 and the first replica 127 by outputting a control signal CS2 having a first level during an initial operation of a clock signal generation circuit 100, and disable each of the DLL replica 125 and the first replica 127 by outputting a control signal CS2 having a second level after determining which of an even clock signal or an odd clock signal to output. Accordingly, power consumed in the clock signal generation circuit 100 may be reduced.

The second replica 131 may generate a first latency control clock signal PLATCLK1 synchronized to an external clock signal EXT_CLK by delaying the even clock signal or the odd clock signal output from the determination unit 140 as long as a fourth delay time dT4.

The first replica 127 and the second replica 131 may be embodied to have the same time delay as time delay for a delay synchronization signal DLL_CLK to pass through an actual clock path. The first replica 127 and the second replica 131 are circuits delaying as long as a delay occurring in an internal read command signal generation unit 111, i.e., delay required while the internal read command signal PREAD_LAT is transmitted to a latency signal generation unit 150.

In this case, a sum of a third delay time dT3 of the first replica 127 and a fourth delay time dT4 of the second replica 131 may be substantially the same as delay time for an internal read command signal PREAD_LAT to be delivered to a latency signal generation unit 150, e.g., delay time that occurs while a read command is transmitted to the latency signal generation unit 150 through a read command decoder 131 and a read signal generation unit 133.

The multi-clock generator 133 may receive an M-divided signal DIV_CLK2 output from a second clock divider 123 and generate a plurality of second latency control clock signals PLATCLK[2:n] having a different phase respectively by delaying the received M-divided signal DIV_CLK2. At least one of a plurality of latency control clock signals PLATCLK1 and PLATCLK [2:n] may be a signal used in latching an internal read command signal PREAD_LAT or adjusting latency.

That is, the latency control clock generation unit 120 may generate latency control clock signals PLATCLK1 and PLATCLK [2:n] having a fixed margin on the internal read command signal PREAD_LAT. The latency signal generation unit 150 may latch the internal read command signal PREAD_LAT by using a first latency control clock signal PLATCLK1; adjust latency, e.g., CAS latency, by using at least one of the plurality of second latency control signal clocks PLATCLK[2:n]; and output a latency-adjusted latency signal LATENCY. The latency signal generation unit 150 may include a plurality of shift registers.

FIG. 2 shows a block diagram of a clock signal generator according to another example embodiment of the present invention. The clock signal generation circuit 100 illustrated in FIG. 2 may further include a phase splitter 129 as compared to a clock signal generation circuit 100 illustrated in FIG. 1.

Accordingly, a function of a determination unit 140' of FIG. 2 may be different from a function of a determination unit 140 of FIG. 1.

When an enable signal DECISION_ON is in a high level, the determination unit 140' may compare a phase of an N-divided signal DIV_CLK1 with a phase of a second control clock signal PDLLO2 and output a control signal CS to the DLL replica 125 and the first replica 127 according to a comparison result. For example, the determination unit 140' outputs a control signal CS having a first level to the DLL replica 125 and the first replica 127 at a beginning of operation, so that the DLL replica 125 and the first replica 127 become enabled. However, the determination unit 140' may compare a phase of the N-divided signal DIV_CLK1 with a phase of the second control clock signal PDLLO2 and output a control signal CS having a second level to the DLL replica 125 and the first replica 127 according to a comparison result. Accordingly, the DLL replica 125 and the first replica 127 may become disabled in response to the control signal CS having a second level.

After outputting the control signal CS having a second level, the determination unit 140' may output the N-divided signal DIV_CLK1 and a selective signal SEL to the phase splitter 129. According to an embodiment, the determination unit 140' may output the selective signal SEL to the phase splitter 129 after outputting the N-divided signal DIV_CLK1 to the phase splitter 129.

The phase splitter 129 may generate at least one of an even clock signal and an odd clock signal by using the N-divided signal DIV_CLK1. For example, a phase of the even clock signal may be identical to a phase of the N-divided signal DIV_CLK1 and a phase of the odd clock signal may be opposite to a phase of the N-divided signal DIV_CLK1.

Like A of FIG. 3 and/or I of FIG. 5, i.e., when the N-divided signal DIV_CLK1 is in a high level at a rising edge of the second control clock signal PDLLO2, the determination unit 140' may output a selective signal SEL for selecting an even clock signal, i.e., a clock signal having an phase identical to a phase of the N-divided signal DIV_CLK1, to the phase splitter 129.

However, like B of FIG. 4 and/or II of FIG. 5, i.e., when the N-divided signal DIV_CLK1 is in a low level at a rising edge of the second control clock signal PDLLO2, the determination unit 140' may output a selective signal SEL for selecting an odd clock signal, i.e., a clock signal having a phase opposite to the N-divided signal DIV_CLK1, to the phase splitter 129. Accordingly, the phase splitter 129 of a latency control clock signal generation unit 120' may output an even clock signal or an odd clock signal in response to the selective signal SEL.

The second replica 131 may generate a first latency control clock signal PLATCLK1 synchronized to an external clock signal EXT_CLK by delaying the even clock signal or the odd clock signal output from the phase splitter 129 as long as a fourth delay time dT4.

The latency signal generation unit 150 may latch an internal read command signal PREAD_LAT by using the first latency control clock signal PLATCLK1; adjust latency, e.g., CAS latency, of a latched internal read command signal PREAD_LAT by using at least one of a plurality of second latency control clock signals PLATCLK [2:n]; and output a latency-adjusted latency signal LATENCY.

The clock signal generation circuit 100 may compare a phase of the second control clock signal PDLLO2 with a phase of the N-divided signal DIV_CLK1 and disable the DLL replica 125 and the first replica 127 after determining which of the even clock signal or the odd clock signal to use, so that it may reduce an amount of current consumed in the DLL replica 125 and the first replica 127. That is, the clock signal generation circuit 100 may enable the DLL replica 125 and the first replica 127 only during an initial operation, e.g., only before comparing a phase of the second control clock signal PDLLO2 with a phase of the N-divided signal DIV_CLK1, and disable the DLL replica 125 and the first replica 127 afterwards, so that it may reduce an amount of current consumed in the clock signal generation circuit 100.

The latency signal generation unit 150 may latch an internal read command signal PREAD_LAT in response to a first latency control clock signal PLATCLK1 synchronized to an external clock signal EXT_CLK and output a latched internal read command signal PREAD_LAT as a latency signal LATENCY in response to one of a plurality of latency control clock signals PLATCLK [2:n]. For example, after latching an internal read command signal PREAD_LAT by using a latch (not shown), the latency signal generation unit 150 may adjust latency by shifting a latched internal read command signal PREAD_LAT by using at least one of a plurality of shift registers (not shown) and output a latency-adjusted latency signal LATENCY.

Accordingly, as an identical clock domain, e.g., an internal read command signal PREAD_LAT and a plurality of latency control clock signals PLATCLK1 and PLATCLK [2:n] using an external clock signal EXT_CLK, is input into the latency signal generation unit 150, the clock signal generation circuit 100 of the present invention may improve a property of high frequency since it is less sensitive to a noise or a change of a power voltage.

The clock signal generation circuit according to embodiments of the present invention may decrease a current consumed in the clock signal generation circuit by controlling enabling or disabling of a plurality of delay circuits, e.g., a plurality of replicas. Additionally, the clock signal generation circuit of the present invention, by generating an internal read command signal and latency control clocks by using an identical clock domain, may not be affected by a change of an external clock signal, which is caused by surroundings, and may operate stably and efficiently all the time.

Although a few embodiments of the present general inventive concepts have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor device, comprising:
   a signal generation circuit configured to generate an internal read command signal by delaying a read command signal and configured to generate a first clock signal by dividing an external clock signal;
   a determination unit configured to generate a control signal and an internal clock signal based on a phase of the first clock signal and a phase of a control clock signal, the internal clock signal having an identical phase or an opposite phase to the first clock signal;
   a latency control clock signal generation unit configured to generate a first latency control clock signal by delaying the internal clock signal, generate the control clock signal by delaying a second clock signal divided from the external clock signal by using a plurality of delay circuits, and generate a plurality of second latency control clock signals having different phases respectively from the second clock signal; and
   wherein the plurality of delay circuits are enabled or disabled in response to the control signal.

2. The semiconductor device of claim 1, further comprising:
 a latency generation unit configured to adjust latency of the internal read command signal by using the first latency control clock signal and the plurality of second latency control clock signals and output a latency-adjusted latency signal.

3. The clock signal generation circuit of claim 2, wherein a division rate of the first clock signal and a division rate of the second clock signal are equal.

4. The clock signal generation circuit of claim 2, wherein the first clock signal and the second clock signal the external clock signal divided by 2.

5. The clock signal generation circuit of claim 2, wherein the latency generation unit is configured to latch the internal read command signal in response to the first latency control clock signal, adjust latency by shifting the latched internal read command signal in response to at least one of the plurality of second latency control clock signals.

* * * * *